United States Patent
Momtaz et al.

(10) Patent No.: US 6,621,362 B2
(45) Date of Patent: Sep. 16, 2003

(54) VARACTOR BASED DIFFERENTIAL VCO BAND SWITCHING

(75) Inventors: Afshin Momtaz, Irvine, CA (US); Armond Hairapetian, Glendale, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 09/860,284

(22) Filed: May 18, 2001

(65) Prior Publication Data

US 2002/0171499 A1 Nov. 21, 2002

(51) Int. Cl.⁷ .................................................. H03L 7/08
(52) U.S. Cl. ............................. 331/117 R; 331/117 FE; 331/167; 331/177 V
(58) Field of Search ....................... 331/117 R, 117 FE, 331/167, 177 V, 179

(56) References Cited

U.S. PATENT DOCUMENTS

| | | |
|---|---|---|
| 3,538,450 A | 11/1970 | Andrea et al. |
| 3,909,748 A | 9/1975 | Yuan et al. |
| 4,003,004 A * | 1/1977 | Fletcher et al. ............. 331/114 |
| 4,638,264 A | 1/1987 | Ueno |
| 5,434,543 A | 7/1995 | Brilka et al. |
| 5,648,744 A | 7/1997 | Prakash et al. |
| 5,686,864 A | 11/1997 | Martin et al. |
| 5,739,730 A | 4/1998 | Rotzoll |
| 5,905,414 A | 5/1999 | Motoi |
| 5,942,950 A | 8/1999 | Merenda |
| 6,100,770 A | 8/2000 | Litwin et al. |
| 6,137,372 A * | 10/2000 | Welland ................. 331/117 R |
| 6,172,378 B1 | 1/2001 | Hull et al. |
| 6,194,975 B1 | 2/2001 | Leizerovich et al. |
| 2001/0035797 A1 * | 11/2001 | Gutierrez .............. 331/117 FE |

OTHER PUBLICATIONS

"A Wide Tuning Range Gated Varactor," Yong et al., *IEEE Journal of Solid–State Circuits*, vol. 35, No. 5, May 2000.

Hsjimir et al., *Design Issues in CMOS Differential LC Oscillators*, IEEE J. Solid–State Circuits, vol. 34, pp. 717–724, May 1999.

Wang et al. *Correspondence: Comments on Design Issues in CMOS Differential LC Oscillators*, IEEE J. Solid–State Circuits, vol. 35, pp. 286–287, Feb. 2000.

* cited by examiner

*Primary Examiner*—Benny Lee
*Assistant Examiner*—Kimberly E Glenn
(74) *Attorney, Agent, or Firm*—Townsend and Townsend and Crew LLP; Babak S. Sani

(57) ABSTRACT

Method and circuitry for implementing VCOs with improved frequency band switching use differentially-coupled varactors to implement the different frequency bands. According to a specific embodiment, one side of a varactor couples to the tank circuit and the other side is coupled either to ground or to the positive power supply VDD without introducing any series parasitic resistance.

22 Claims, 3 Drawing Sheets

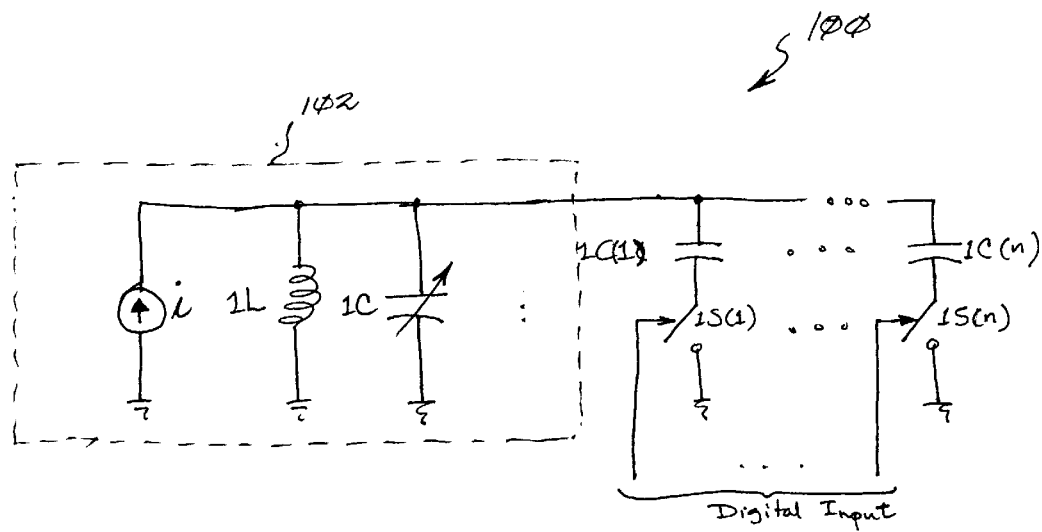
— FIGURE 1 —
(PRIOR ART)
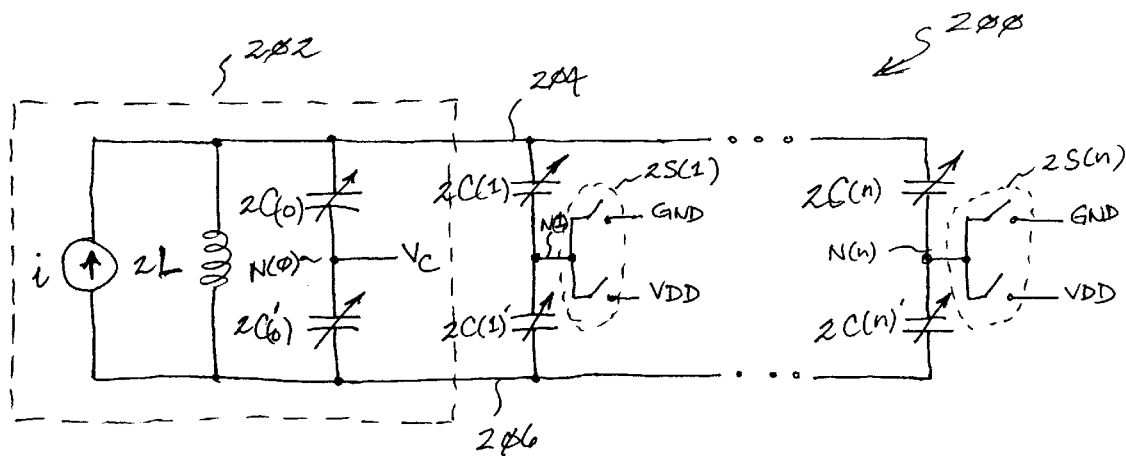
— FIGURE 2A —

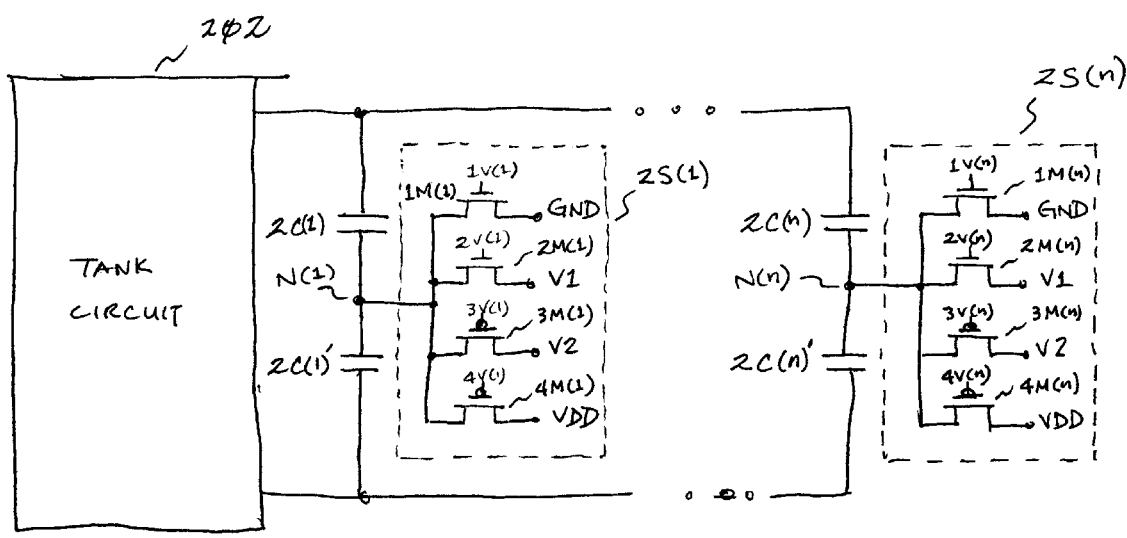
– FIGURE 2B –

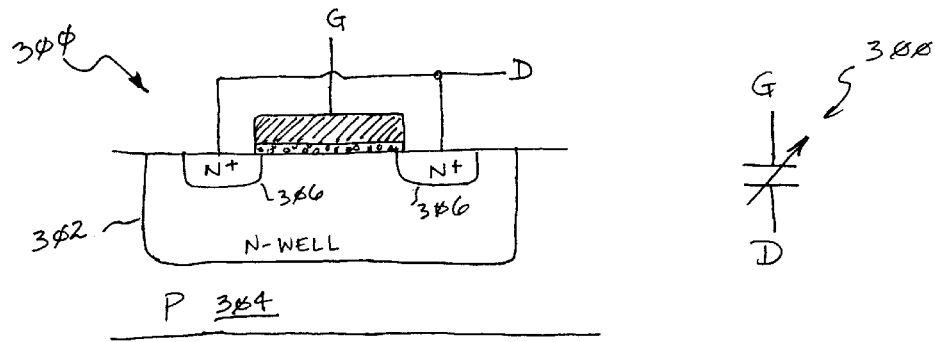
— FIGURE 3 —
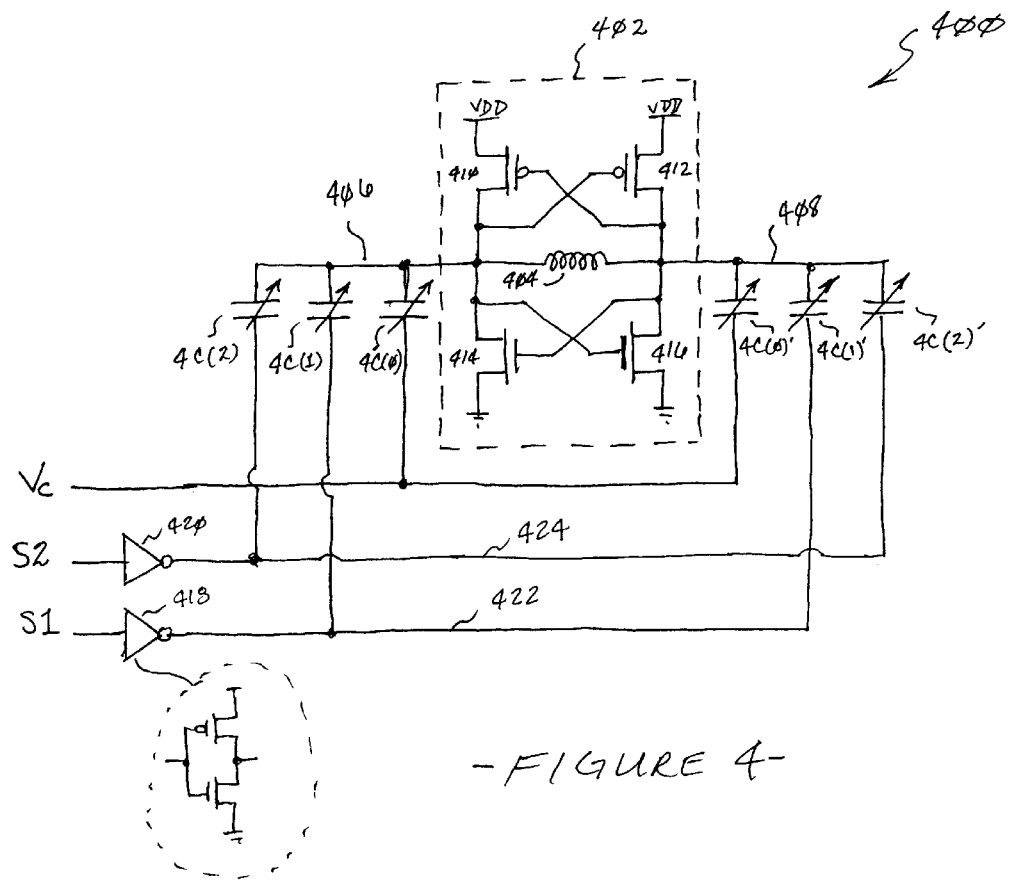
— FIGURE 4 —

VARACTOR BASED DIFFERENTIAL VCO BAND SWITCHING

BACKGROUND OF THE INVENTION

The present invention relates in general to integrated circuits, and in particular to improved method and circuitry for implementing a voltage-controlled oscillator (VCO).

A voltage-controlled oscillator is an oscillator that generates an output signal with a frequency that varies in response to an input control voltage. VCOs can be found in many circuit applications. For example, a VCO is the central block in phase-locked loops (PLLs) and as such is one of the most important blocks in data commination circuitry. Many circuit applications demand a wide output frequency range for the VCO. Because of its non-linear response to the input control voltage, a VCO typically requires a large gain, Kvco, if a wide output frequency range is desired. The VCO gain, however, has the undesirable effect of amplifying any noise in the input voltage signal to the VCO, resulting in what is commonly referred to as phase noise. This phase noise in turn contributes to output signal jitter and adversely affects the overall performance of the PLL. While reducing Kvco helps reduce the phase noise, it limits the frequency range of the VCO and limits the circuit's ability to compensate for process and environment variations.

To address both of these requirements, i.e., large gain (wide frequency range) and low phase noise, VCOs have been implemented that can switch between multiple narrow frequency bands. The VCO operates in each narrow band of frequency with lower gain and therefore lower phase noise, while the multiple bands combined provide for the wider overall frequency range. Moreover, since inductor/capacitor (LC) based VCOs have lower phase noise than traditional VCOs using ring oscillators, they are being used more and more in low noise applications. In this type of VCO, the oscillation frequency F is given by the inductance L and capacitance C as follow:

$$F = 1/(2 \times pi \times sqrt(L \times C))$$

In the LC based VCO the phase noise is directly related to the amount of parasitic resistance in series with L or C. FIG. 1 shows a conventional LC VCO 100 with band switching. VCO 100 includes resonant LC tank circuit 102 having an inductor 1L coupled to a variable capacitor (or varactor) 1C. Multiple switchable capacitors 1C(1) to 1C(n) connect to tank circuit 102 as shown. Switches 1S(1) to 1S(n) are digitally controlled and when activated modify the total capacitance in the LC circuit causing the VCO frequency to switch frequency bands. A similar band switching can be achieved by switching additional inductors in parallel (or in series) with the active circuit.

A drawback of this approach, however, is the finite resistance that is introduced by the switches. Switches 1S(1) to 1S(n) are typically implemented by metal-oxide-semiconductor (MOS) transistors. When turned on, the on-resistance of the MOS switch is placed in series with its respective switchable capacitor. This parasitic resistance adds to the loss in the tank circuit and deteriorates the overall VCO performance. A potential problem also arises when the switches are in their off state. Under this condition, the switched node of the capacitor is left floating and as such is made susceptible to noise.

There is therefore a need for improved implementations of VCOs with band switching capability.

BRIEF SUMMARY OF THE INVENTION

The present invention provides method and circuitry for implementing VCOs with improved frequency band switching. Broadly, the VCO of the present invention uses differentially-coupled varactors to implement the different frequency bands. According to a specific embodiment, one side of a varactor couples to the tank circuit and the other side is coupled either to ground or to the positive power supply VDD without introducing any series parasitic resistance. When switched to ground, the VCO tank sees the full capacitance of the varactor. When switched to VDD, the capacitance of the varactor as seen by the tank circuit is minimized. In one exemplary embodiment, the present invention implements the varactors using a field effect transistor structure with the gate terminal acting as one node of the varactor and the source/drain terminals coupled together providing the other node of the varactor.

Accordingly, in one embodiment, the present invention provides a voltage controlled oscillator (VCO) including: a differential inductor/capacitor (L/C) tank circuit coupled between a first node and a second node; and at least one pair of varactors coupled to the tank circuit, the pair of varactors including a first varactor connected between the first node and a switching node, and a second varactor connected between the second node and the switching node, wherein, an output frequency band of the VCO is modified by switching the potential at the switching node.

In a more specific embodiment of the present invention the VCO further includes a switching circuit coupled to the switching node and configured to switch the potential at the switching node between a high voltage and a low voltage. The switching circuit may be an inverter with the high voltage being the circuit power supply voltage and the low voltage being ground.

In another embodiment, the present invention provides a differential voltage controlled oscillator including: an inductor coupled between a first node and a second node; a cross-coupled pair of p-channel transistors respectively coupling the first and second nodes to a power supply node; a cross-coupled pair of n-channel transistor respectively coupling the first and second nodes to ground; a first fixed varactor having a first terminal connected to the first node and a second terminal connected to receive a control signal; a second fixed varactor having a first terminal connected to the second node and a second terminal connected to receive the control signal; a first variable varactor having a first terminal connected to the first node and a second terminal connected to a switching node; a second variable varactor having a first terminal connected to the second node and a second terminal connected to the switching node, and an inverter having an input coupled to receive a switching signal and an output connected to the switching node.

In yet another embodiment, the present invention provides a method for switching a frequency band of a voltage controlled oscillator output signal, the method including: adding a first capacitance to a differential tank circuit by applying a first signal to a common node of a differential pair of varactors; and adding a second capacitance to the differential tank circuit by applying a second signal to the common node of the differential pair of varactors. The common node of the differential pair of varactors is an ac ground.

The detailed description and the accompanying drawings provide a better understanding of the nature and advantages of the signal level converter of the present invention.

BRIEF DESCRIPTION OF THE DRAWINGS

FIG. 1 shows a conventional implementation for an LC VCO with band switching;

FIG. 2A depicts a simplified exemplary implementation for an LC VCO with band switching according to one embodiment of the present invention;

FIG. 2B depicts a variation on the band switching embodiment of the LC VCO shown in FIG. 2A;

FIG. 3 shows an exemplary implementation for a varactor according to the present invention; and FIG. 4 shows an exemplary circuit implementation for an LC VCO with differential band switching according to an illustrative embodiment of the invention.

DESCRIPTION OF THE SPECIFIC EMBODIMENTS

Referring to FIG. 2A, there is shown an exemplary implementation for an LC VCO 200 with band switching according to one embodiment of the invention. A differential LC tank circuit 202 includes an inductor 2L coupled in parallel with a pair of variable capacitors (or varactors) 2C(0) and 2C(0)' whose common node N(0) receives a control voltage Vc. Differential tank circuit 202 connects between nodes 204 and 206, with control voltage Vc controlling its resonant frequency. To implement frequency band switching, VCO 200 further includes, in this specific embodiment, n differentially switchable pairs of varactors 2C(1)/2C(1)' to 2C(n)/2C(n)' connected in parallel to tank circuit 202 as shown. Each pair of differentially switchable varactors includes a first varactor 2C(i) that connects between node 204 and a common node N(i), and a second varactor 2C(i)' that connects between node 206 and the common node N(i), (i is any integer between 1 and n). Each common node N(i) is then connected to a digitally controlled switch circuit 2S(i) that can switch the node to one of two potentials, in this case, the positive power supply VDD and ground GND. The switch circuits are, in one embodiment, implemented using field effect transistors switches.

In operation switchable varactors 2C(i) cause the VCO frequency to switch from one band to another, with control voltage Vc controlling the frequency within a given band. When switch circuit 2S(1), for example, connects node N(1) to GND, the fill capacitance of varactors 2C(1) and 2C(1)' are added to the capacitance of the tank circuit switching the VCO frequency to another band. When connected to VDD, the capacitance is minimized. Any number of frequency bands can be provided by adding the desired number of differentially switchable varactors. This implementation of the differential VCO according to the invention has a number of advantages over conventional VCOs. Since switch circuits 2S(i) are not connected in series with varactors 2C(i)/2C(i)', unlike prior art implementations, their resistance does not add to the loss in the tank circuit. Due to the differential nature of the circuit, nodes N(1) to N(n) are AC grounds. Accordingly, any resistance introduced by the switches that connect to these nodes will not impact the operation of the tank circuit. Furthermore, switching nodes N(1) to N(n) are at all times either connected to GND or to VDD. There is therefore no floating node or floating varactor terminal in this implementation eliminating a potential source of noise.

According to the invention, additional frequency bands can be provided not only by increasing the number of switchable varactors that connect to nodes 204 and 206, but also by increasing the number of switches inside switch circuits 2S(i). Referring to FIG. 2B, there is shown an alternative embodiment for the LC VCO 200 wherein switch circuits 2S(i) include more than two switches that connect their respective common node N(i) to more than two potentials. In the exemplary embodiment shown, switch 2S(1) includes four switches each of which is implemented by a field effect transistor (FET): 1M(1), 2M(1), 3M(1) and 4M(1). Switch transistors 1M(1) through 4M(1) may be either n-channel (i.e., NMOS transistor) as in the case of 1M(1) and 2M(1), or p-channel (i.e., PMOS transistor) as in the case of 3M(1) and 4M(1). The polarity will generally depend on the level of the voltage that is being transferred through the transistor channel. In an alternate embodiment, all switch transistors may be made of transmission gates wherein each switch would include both a PMOS and an NMOS transistor coupled in parallel. Switch transistors 1M(1) through 4M(1) are controlled by voltages 1V(1) through 4V(4) respectively, and connect the AC ground node N(1) to GND, V1, V2, and VDD, respectively. Switch circuit 2S(1) thus provides four different bands of frequency by connecting node N(1) to any one of four potentials. With n switchable varactors, the embodiment shown in FIG. 2B can provide 4×n bands of frequency. It is to be understood that the number of switches in each switch circuit can vary and four is used herein for illustrative purposes only. Thus if each switch circuit includes m switches that connect their respective AC ground node to m potentials, and the circuit includes n switchable varactors, then the LC VCO according to this embodiment would have m×n bands of frequency.

Varactors 2C can be implemented in a variety of ways. One particular implementation is shown in FIG. 3. In this example, metal-oxide-semiconductor (MOS) technology is used to form a varactor using an n-channel MOS (or NMOS) transistor structure inside an N-well. Referring to FIG. 3 there is shown a cross-section of varactor 300 in the form of an NMOS in an N-well. The gate G of the NMOS structure is typically formed of polysilicon material overlying a thin gate dielectric made of silicon dioxide. An N-type well 302 is formed on a P-type substrate 304. N+ drain regions 306 are formed inside N-well 302 as shown. Drain regions 306 are connected together and form one terminal of varactor 300, with gate G forming the other terminal. The NMOS device as thus constructed is equivalent to a p-channel MOS (PMOS) transistor operating in the accumulation region. When VDD is applied to the gate or control terminal of varactor 300, its capacitance is reduced by about one third.

Referring to FIG. 4, there is shown one exemplary circuit implementation for an LC VCO 400 with differential band switching according to an embodiment of the invention. A tank circuit 402 includes an inductor 404 connecting between nodes 406 and 408. A cross-coupled pair of PMOS transistors 410/412 couple nodes 406 and 408 to VDD, and a cross-coupled pair of NMOS transistors 414/416 couple nodes 406 and 408 to ground. With some parasitic capacitance at nodes 406 and 408 tank circuit 402 can oscillate. A first pair of varactors 4C(0)/4C(0)' have their first terminals respectively connected to nodes 406 and 408. Their second terminals connect together and receive a control voltage Vc. A second pair of varactors 4C(1)/4C(1)' are similarly connected to nodes 406 and 408, except their second terminals are driven by an inverter 418. A third pair of varactors 4C(2)/4C(2)' also connect to nodes 406 and 408 with their second terminals driven by an inverter 420. Inverters 418 and 420 may be conventional CMOS inverters, each having a PMOS pull-up and an NMOS pull-down transistor. The inverters perform the equivalent function as switches 2S(i) in FIG. 2. Signals S1 and S2 drive the input terminals of inverters 418 and 420, respectively. As thus constructed VCO 400 has four frequency bands of operation. When both S1 and S2 are at ground, inverters 418 and 420 drive nodes 422 and 424 to VDD reducing the capacitance contribution of varactors 4C(1)/4C(1)' and 4C(2)/4C(2)' to their minimum. Control voltage Vc then varies the capacitance of varactors 4C(0)/4C(0)' to obtain the desired frequency within the first band. By switching S1 to logic high, inverter 418 drives node 422 to ground and the maximum capacitance value of varactors 4C(1)/4C(1)' are added to tank circuit 402. This causes VCO 400 to switch to a second band of frequency within which a desired frequency can be obtained by varying Vc. Similarly by providing logic low on S1 and logic high on S0, the maximum capacitance value of varactors 4C(2)/4C(2)' and minimum capacitance value of 4C(1)/4C(1)' are added to the tank and the VCO is shifted to the third band. If the capacitors 4C(1) and 4C(2) have the exact same value, the second and the third band would become one. The VCO can switch to a fourth band of frequency by applying logic high to inputs of both inverters 418 and 420. Under this mode of operation the capacitance at nodes 406 and 408 is maximized with varactors 4C(1)/4C91)' and 4C(2)/4C(2)' contributing their full value of capacitance.

The differential nature of VCO 400 renders nodes 422 and 424 AC grounds and as such the output resistance of inverters 418 and 420 have no impact on the tank frequency. Nor does this implementation leave any node or varactor terminals floating. Nodes 422 and 424 are driven to one of ground or VDD at all times. As many desired additional bands of frequency can be provided by adding pairs of differential varactors with their control terminals driven by inverters. It is to be understood that the particular implementation for tank circuit 402 shown in FIG. 4 is for illustrative purposes only and that the invention can operate with many different types of tank circuits.

The present invention thus provides method and circuitry for implementing VCOs with improved frequency band switching. The VCO of the present invention uses differentially-coupled varactors to implement the different frequency bands. According to a specific embodiment, one side of a varactor couples to the tank circuit and the other side is coupled either to ground or to the positive power supply VDD without introducing any series parasitic resistance. While the above provides a complete description of specific embodiments of the present invention, it is possible to use various alternatives, modifications and equivalents. Therefore, the scope of the present invention should not be limited to the specific and illustrative embodiment described above, and should instead by determined with reference to the appended claims along with their full scope of equivalents.

What is claimed is:

1. A voltage controlled oscillator (VCO) comprising:
   a differential inductor/capacitor tank circuit connected between a first node and a second node, the differential inductor/capacitor tank circuit having a control node coupled to receive a control signal, wherein a frequency of operation of the VCO within a frequency band is varied by varying the control signal;
   a first band-switching varactor connected between the first node and a switching node; and
   a second band-switching varactor connected between the second node and the switching node, in series with the first band switching varactor
   wherein, a frequency band of the VCO is modified by switching a signal at the switching node.

2. The VCO of claim 1 further comprising a switch circuit connected to the switching node and configured to switch the signal at the switching node between one of a first or second levels.

3. The VCO of claim 2 wherein the first level is positive power supply VDD to the VCO, and the second level is ground.

4. The VCO of claim 2 wherein when the switch circuit switches the switching node to the first level, the VCO operates in a first band of frequency, and when the switch circuit switches the switching node to the second level the VCO operates in a second band of frequency.

5. The VCO of claim 3 wherein the differential tank circuit comprises:
   an inductor connected between the first node and the second node;
   a first frequency control varactor connected between the first node and the control node; and
   a second frequency control varactor connected between the second node and the control node.

6. The VCO of claim 2 wherein the switch circuit comprises:
   a first switch connected between the first level and the switching node; and
   a second switch connected between the second level and the switching node.

7. The VCO of claim 6 wherein the first and second switches comprise transistors.

8. The VCO of claim 2 wherein the switch circuit comprises an inverter.

9. The VCO of claim 1 wherein each varactor comprises an NMOS inside an N-well structure with drain terminals of the NMOS providing a first terminal of the varactor and a gate terminal of the NMOS providing a second terminal of the varactor.

10. The VCO of claim 5 wherein the tank circuit further comprises:
    a first pair of cross-coupled transistors respectively connecting the first and second nodes to a positive power supply; and
    a second pair of cross-coupled transistors respectively connecting the first and second nodes to ground.

11. The VCO of claim 10 wherein the first pair of cross-coupled transistors comprise PMOS transistors, and the second pair of cross-coupled transistors comprise NMOS transistors.

12. A method of operating a differential voltage controlled oscillator, the method comprising:
    setting a resonant frequency of the differential voltage controlled oscillator within a frequency band, by applying a control signal to a control node of a differential tank circuit;
    switching the frequency band by adding a first capacitance to the differential tank circuit by applying a first signal to a common node of a differential serially connected pair of varactors; and
    switching the frequency band by adding a second capacitance to the differential tank circuit by applying a second signal to the common node of the differential pair of serially connected varactors.

13. The method of claim 12 wherein the step of adding the first capacitance comprises applying the first signal to the common node by closing a first switch.

14. The method of claim 13 wherein the step of adding the second capacitance comprises applying the second signal to the common node by opening the first switch and closing a second switch.

15. The method of claim 13 wherein the first signal is a logic high signal and the second signal is a logic low signal.

16. A differential voltage controlled oscillator comprising:
    a differential LC tank circuit connected between a first node and a second node;

a plurality of pairs of varactors each pair having a first varactor with a first terminal connected to the first node and a second varactor with a first terminal connected to the second node, second terminals of each pair connecting to a common node; and a plurality of switch circuits each connected to a respective common node of the plurality of pairs of varactors, wherein, each switch circuit is configured to switch its respective common node between one of a first voltage or a second voltage.

17. The differential voltage controlled oscillator of claim 16 wherein the common node in each pair of varactors is an ac ground.

18. The differential voltage controlled oscillator of claim 16 wherein each switch circuit comprises:

a first transistor connected between the common node and the first voltage; and a second transistor connected between the common node and the second voltage.

19. The differential voltage controlled oscillator of claim 16 wherein each switch circuit comprises a CMOS inverter.

20. The differential voltage controlled oscillator of claim 16 wherein, when added to the differential tank circuit, each pair of varactors switches a frequency band of the voltage controlled oscillator.

21. The differential voltage controlled oscillator of claim 16 wherein each of the plurality of switch circuits comprises a plurality of switches that are configured to connect a plurality of voltage levels to the common node of the switch circuit.

22. The differential voltage controlled oscillator of claim 21 wherein a frequency band of the voltage controlled oscillator is switched by switching one the plurality of switches in one of the plurality of switch circuits.

* * * * *